(12) United States Patent
Ohno et al.

(10) Patent No.: US 7,763,486 B2
(45) Date of Patent: Jul. 27, 2010

(54) METHOD FOR MANUFACTURING NITRIDE SEMICONDUCTOR STACKED STRUCTURE AND SEMICONDUCTOR LIGHT-EMITTING DEVICE

(75) Inventors: Akihito Ohno, Tokyo (JP); Masayoshi Takemi, Tokyo (JP); Nobuyuki Tomita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 140 days.

(21) Appl. No.: 11/950,494

(22) Filed: Dec. 5, 2007

(65) Prior Publication Data

US 2009/0008659 A1    Jan. 8, 2009

(30) Foreign Application Priority Data

Jul. 2, 2007    (JP) .............................. 2007-174440

(51) Int. Cl.
    *H01L 33/02*    (2010.01)
(52) U.S. Cl. .................................. 438/47; 257/E33.025
(58) Field of Classification Search .................. 257/94, 257/96, E33.028, E21.098, E33.025; 438/47
    See application file for complete search history.

(56) References Cited

U.S. PATENT DOCUMENTS

| | | | |
|---|---|---|---|
| 5,740,192 A * | 4/1998 | Hatano et al. ............ | 372/45.01 |
| 5,902,393 A | 5/1999 | Nido et al. | |
| 6,043,140 A | 3/2000 | Kawai et al. | |
| 6,284,042 B1 | 9/2001 | Sasaoka | |
| 6,508,879 B1 * | 1/2003 | Hashimoto ................... | 117/104 |
| 6,617,235 B2 | 9/2003 | Iyechika et al. | |
| 2006/0138446 A1 * | 6/2006 | Yoo et al. ..................... | 257/103 |

FOREIGN PATENT DOCUMENTS

| | | | |
|---|---|---|---|
| JP | 8-56015 | A | 2/1996 |
| JP | 8-316151 | A | 11/1996 |
| JP | 8-325094 | A | 12/1996 |
| JP | 9-199758 | A | 7/1997 |
| JP | 9-251957 | A | 9/1997 |
| JP | 10-4211 | A | 6/1998 |
| JP | 2001-15437 | A | 1/2001 |
| JP | 2001-144325 | A | 5/2001 |
| JP | 2002-319743 | A | 10/2002 |
| JP | 2003-178987 | A | 6/2003 |
| JP | 2004-47867 | A | 2/2004 |
| JP | 2008-078186 | A | 4/2008 |

OTHER PUBLICATIONS

Hsu, Yu Jen, "Low Temperature metalorganic chemical vapor deposition of gallium nitride using dimethylhydrazine as nitrogen source", Thin Solid Films, 419:33-39 (2002).
Park, E. et al.; "As-grown p-type GaN growth by dimethylhydrazine nitrogen precursor", *J. of Crystal Growth*, 272, pp. 425-431, (2004).

\* cited by examiner

*Primary Examiner*—Victor A Mandala
*Assistant Examiner*—Scott Stowe
(74) *Attorney, Agent, or Firm*—Leydig, Voit & Mayer, Ltd.

(57) ABSTRACT

A nitride semiconductor stacked structure having good working efficiency includes a p-type nitride semiconductor layer of low resistance, which is formed from an organometallic compound, compounds including Group V elements, including ammonia and a hydrazine derivative, and a p-type impurity material on a substrate. The p-type nitride layer has a carbon concentration not higher than $1 \times 10^{18}$ cm$^{-3}$.

10 Claims, 3 Drawing Sheets

METHOD FOR MANUFACTURING NITRIDE SEMICONDUCTOR STACKED STRUCTURE AND SEMICONDUCTOR LIGHT-EMITTING DEVICE

BACKGROUND OF THE INVENTION

1. Field of the Invention

The present invention relates to a nitride semiconductor stacked structure and a semiconductor optical device, and methods for manufacturing the same. More particularly, the invention relates to a nitride semiconductor stacked structure and a semiconductor optical device, both formed by use of Group V materials including ammonia and a hydrazine derivative and a Group III material of an organometallic compound and also to methods for manufacturing the same.

2. Description of the Related Art

Recently, extensive studies and developments of semiconductor lasers capable of light emission ranging from a blue region to a ultraviolet region have been made for high densification of optical disks. For GaN compound semiconductors used as such a blue to violet region diode (laser diode being referred to hereinafter as LD), mentions is made, for example, of GaN, GaPN, GaNAs, InGaN, AlGaN, AlGaInN and the like. GaN semiconductor lasers using nitride semiconductors, such as AlGaInN, have been already put into practice.

For a growth method of a nitride semiconductor, it is usual to use $NH_3$ as a Group V material. In this connection, however, where a p-type semiconductor is grown, the hydrogen atom (H) decomposed from $NH_3$ and a P dopant such as, for example, Mg are combined, with the result that the p-type semiconductor layer after the growth exhibits a high resistance. In order to solve this, for example, thermal treatment is carried out after the crystal growth to activate Mg, thereby ensuring a low resistance.

However, when the thermal treatment is carried out, there may be some possibility that nitrogen (N) desorbed from the surface of the p-type semiconductor layer, thereby degrading the crystal. Nitrogen materials, which do not release hydrogen, e.g. hydrazine materials and amine materials, have been used in some case.

For a method of manufacturing a known nitride compound semiconductor, there is disclosed a method wherein ammonia and a hydrazine are both used as a nitrogen material in such a way that a concentration of the hydrazine ranges from $1 \times 10^{-3}$ Vol % to 20 vol % and a ratio of a feed of the hydrazine to the total of a feed of the ammonia and the feed of the hydrazine ranges from $1 \times 10^{-3}$ vol % to 10 vol %. It is also disclosed that although a carrier gas used may include gases, such as hydrogen, nitrogen, argon, helium and the like, used singly or in combination, a hydrogen concentration in a preferred carrier gas is at 10 volt or below (see, for example, JP-A-9-251957, Paragraph Numbers [0008] and [0012]).

For a known AlGaInN thin film formation method, there is disclosed a method wherein a substrate temperature is raised to 1000° C. and ammonia is introduced in addition to a hydrazine as a Group V material. After one minute, trimethylgallium is introduced as a Group III material to permit a 3 μm thick GaN layer to be formed, followed by stopping the introduction of trimethylgallium and dropping the substrate temperature to 800° C. Thereafter, trimethylgallium, trimethylaluminum and trimethylindium are simultaneously introduced to grow a 0.5 μm thick $Al_{0.45}Ga_{0.5}In_{0.05}N$ layer. Next, the introduction of trimethylgallium, trimethylaluminium and trimethylindium is stopped, after which the substrate temperature is dropped to 300° C. or below, at which the introduction of the hydrazine and ammonia is stopped (see, for example, JP-A-8-56015, Paragraph Number [0031]).

The following method is disclosed as a known method for manufacturing a nitride semiconductor light-emitting device.

To try to improve the high quality of a nitride semiconductor light-emitting device, the growth temperature of a GaN layer is set at a level lower than hitherto known and a difference in growth temperature between the GaN layer and an GaN active layer is demanded to be controlled within 150° C. In an instance of a MOCVD method, any one of a hydrazine, a substitution product thereof and an amine-based nitrogen compound is used and particularly, a nitrogen compound having a high decomposition efficiency at a temperature as low as 700° C. or below is selected therefrom. These may be used in admixture and may contain ammonia. For a Ga source, TMG (trimethylgallium) or TEG (triethylgallium) is used, for an In source, TMI (trimethylindium) is used, and for an Al source, TMA (trimethylaluminium) is used. As an n-type dopant, $SiH_4$ is used and bismethylcyclopentadienyl-magnesium is used as a p-type dopant.

Initially, a first buffer layer (low temperature growth layer) of GaN is grown on a c-face sapphire substrate at a low temperature, after which a second buffer layer of GaN, an n-GaN contact layer, an n—AlGaN cladding layer, an n-GaN optical guide layer and a GaInN active layer are grown at a constant growth temperature of 700° C., followed by successively forming, on the GaInN active layer, a p-GaN optical guide layer, an AlGaN barrier layer, a p—AlGaN cladding layer and a p-GaN contact layer in the same manner as in related art at the same growth temperature as used conventionally. (See, for example, JP-A-2004-47867, Paragraph Numbers [0013] and [0023]-[0025] and FIG. 2.)

For a known method of manufacturing a p-type Group III nitride semiconductor, there is disclosed a method wherein in an atmosphere of a mixed gas of monomethylhydrazine and $NH_3$, TMG, TMI, TMA and $(EtCp)_2Mg$ are supplied using hydrogen as a carrier gas to permit a 0.6 μm thick p-cladding layer made of a superlattice with a 50 periods structure of alternate 6 nm thick $In_{0.05}Al_{0.24}Ga_{0.71}N$ layer and 6 nm thick $In_{0.2}Ga_{0.80}N$ layer to be grown, followed by raising the temperature to 1050° C. to stack a 0.2 μm thick p-type GaN contact layer (see, for example, JP-A-2002-319743 and Paragraph Number [0085]).

As a known method of manufacturing a p-type Group III nitride semiconductor, there is disclosed a method wherein a c-face sapphire substrate on which an undoped GaN buffer layer has been formed is placed in a reaction furnace of an MOCVD apparatus and $N_2$ gas alone is introduced into the reaction furnace as a carrier gas. Thereafter, the substrate temperature is so raised that when it exceeds 500° C., 2 mmols/minute of trimethylamine used as an N material is introduced and the substrate temperature is kept at 850° C., under which TMG serving as a Ga material is fed to the reaction furnace at a rate of 10 μmols/minute and cyclopentadienylmagnesium ($CP_2Mg$) serving as a p-type dopant is likewise fed at a rate of 25 μmols/minute, followed by growth for 2 hours to form a p-type GaN layer doped with Mg as a p-type impurity.

In addition, there is also disclosed a method wherein a c-face sapphire substrate on which a GaN buffer layer has been formed is placed in a reaction furnace of an MOCVD apparatus and NZ gas alone is introduced into the reaction furnace as a carrier gas. Thereafter, the substrate temperature is so raised that when it exceeds 500° C., 2 mmols/minute of 1,1-dimethylhydrazine used as an N material is introduced and the substrate temperature is kept at 850° C., under which TMG serving as a Ga material is fed to the reaction furnace at a rate of 10 μmols/minute and DMZ serving as a p-type dopant is likewise fed at a rate of 25 μmols/minute, followed by growth for 2 hours to form a p-type GaN layer doped with Zn as a p-type impurity. (See, for example, Japanese Patent Publication No. 3711635, Paragraph Numbers [0027]-[0028] and [0032].)

For a known method of manufacturing a p-type Group IIII nitride semiconductor, there is disclosed a method wherein trimethylgallium (TMGa) and trimethylindium (TMIn) are, respectively, used as starting materials for Ga and In in an MOCVD method and biscyclopentadienylmagnesium ($CP_2Mg$) is used as a p-type dopant, with which a p-GaN layer is grown in an atmosphere of a mixed gas of dimethyl hydrazine (DMHy) and $NH_3$, and U-GaN, N-GaN and MQW are, respectively, formed in an atmosphere of $NH_3$. Although a hydrazine starting material such as DMHy, tertiary butylhydrazine (TBNy) or the like is used for the formation of a GaN or InGaN layer at a lower temperature, the results of experiments are immediately compared with one another in this method, for which p-GaN is grown at a temperature exceeding 1000° C. under similar conditions as in the conventional formation of p-GaN by use of $NH_3$. (See Eun-Hyun Park et al., "As grown p-type GaN growth by dimethylhydrazine nitrogen precursor", Journal of Crystal Growth 272 (2004)426-431, page 427, Experiments.)

Where ammonia ($NH_3$) is used as a Group V material in a method of growing a nitride semiconductor, the H radical formed from $NH_3$ is taken in the crystal, thereby causing H passivation to occur or lowering an activity rate of a p-type dopant. As a consequence, the resulting p-type semiconductor layer exhibits a high resistance. This needs annealing so as to increase the activity rate of the p-type dopant when $NH_3$ is used, and thus, not only the manufacturing process becomes complicated, but also there is the possibility that nitrogen (N) desorbs from the surface of the p-type semiconductor to degrade the crystal.

On the other hand, when a material incapable of generating a H radical, e.g. dimethylhydrazine (UDMHy), is used as a Group V material in place of $NH_3$ and a Group III material of an organometallic compound is used, carbon (C) is taken in the crystal, with the attendant problem that there is some possibility that the resulting p-type semiconductor layer exhibits a high resistance.

SUMMARY OF THE INVENTION

The present invention has been made so as to solve the above problem and a first object is to provide a nitride semiconductor stacked structure comprising a p-type nitride semiconductor layer of low resistance which is formed by use of a Group III material of an organometallic compound and Group V materials including a hydrazine derivative. A second object is to provide a semiconductor light-emitting device comprising a p-type nitride semiconductor layer of lower resistance formed by using a Group III material of an organometallic compound and Group V materials including a hydrazine derivative. A third object is to provide a method for manufacturing, by a simple process, a nitride semiconductor stacked structure comprising a p-type nitride semiconductor layer of low resistance by using a Group III material of an organometallic compound and Group V materials including a hydrazine derivative. A fourth object is to provide a method for manufacturing, by a simple process, a semiconductor light-emitting device comprising a p-type nitride semiconductor layer of low resistance by using a Group III material of an organometallic compound and Group V materials including a hydrazine derivative.

According to one aspect of the present invention, there is provided a nitride semiconductor stacked structure comprising: a substrate; and a p-type nitride semiconductor layer formed, on the substrate, by materials including a Group III material of an organometallic compound, Group V materials including ammonia and a hydrazine derivative, and a p-type impurity material, the p-type nitride semiconductor layer having a carbon concentration of not higher than $1 \times 10^{18}$ $cm^{-3}$.

Accordingly, in the nitride semiconductor stacked structure according to the present invention, there can be constituted a nitride semiconductor stacked structure comprising a p-type nitride semiconductor layer of low resistance, which is formed by the Group III material of an organometallic compound and the Group V materials including ammonia and a hydrazine derivative, has a carbon concentration of not higher than $1 \times 10^{18}$ $cm^{-3}$ and has a good working efficiency.

According to another aspect of the present invention, there is provided a semiconductor light-emitting device comprising: a substrate; an n-type cladding layer of a nitride semiconductor on the substrate; an active layer on the n-type cladding layer; and a p-type cladding layer formed, on the active layer, by materials including a Group III material of an organometallic compound, Group V materials including ammonia and a hydrazine derivative, and a p-type impurity material, the p-type cladding layer having a carbon concentration of not higher than $1 \times 10^{18}$ $cm^{-3}$.

Accordingly, in the semiconductor light-emitting device according to the present invention, there can be constituted a semiconductor light-emitting device including a p-type cladding layer of a p-type nitride semiconductor, which is formed by use of a Group III material of an organometallic compound, Group V materials including ammonia and a hydrazine derivative in combination and has a carbon concentration of not higher than $1 \times 10^{18}$ $cm^{-3}$ and a low resistance, such a device having a good working efficiency.

According to further aspect of the present invention, there is provided a method for manufacturing a nitride semiconductor stacked structure, comprising: mounting a substrate in a reaction furnace, feeding a given type of Group V material and raising a temperature of the substrate to a range of higher than 800° C. to lower than 1200° C.; forming a p-type nitride semiconductor layer on the substrate at the raised substrate temperature by feeding a Group III material of an organometallic compound, Group V materials including ammonia and a hydrazine derivative, and a p-type impurity material at predetermined molar flow rates, respectively, at a feed molar ratio of the hydrazine derivative to the Group III material being smaller than 25 and a feed molar ratio of the ammonia to the hydrazine derivative being within a range of not smaller than 10 to smaller than 1000 along with nitrogen gas and hydrogen gas as a carrier gas at predetermined compositional ratio by volume; and cooling the substrate to room temperature after stopping the feeds of the Group III material of the organometallic compound and the p-type impurity material.

Accordingly, in the method for manufacturing a nitride semiconductor stacked structure, there can be formed a p-type nitride semiconductor layer, which is formed by feeding the Group III material of an organometallic compound and the Group V materials including ammonia and a hydrazine derivative at given feed flow rates along with a p-type impurity material, is prevented from carbon, ascribed to the hydrazine derivative, being taken therein. In addition, C formed from the Group III material of an organometallic compound is also prevented from being taken in the p-type nitride semiconductor layer. Thus, there can be manufactured, by a simple process, a nitride semiconductor stacked structure of a good working efficiency which includes the p-type nitride semiconductor layer of low resistance.

According to still further aspect of the present invention, there is provided a method for manufacturing a semiconductor light-emitting device, comprising: mounting a substrate in a reaction furnace, feeding a given type of Group V material and raising a temperature of the substrate to a range of higher than 800° C. to lower than 1200° C. forming a n-type nitride semiconductor layer on the substrate at the raised substrate temperature by feeding a Group III material, Group V material, and a n-type impurity material at predetermined molar flow rates, respectively; forming an active layer of a nitride semiconductor having a quantum well structure at a given growth temperature by feeding a Group III material and Group V material at predetermined molar flow rates, respectively; forming a p-type nitride semiconductor layer by feeding a Group III material of an organometallic compound, Group V materials including ammonia and a hydrazine derivative, and a p-type impurity material at predetermined molar flow rates, respectively, at a feed molar ratio of the hydrazine derivative to the Group III material of an organometallic compound being smaller than 25 and a feed molar ratio of the ammonia to the hydrazine derivative being within a range of not smaller than 10 to smaller than 1000 along with nitrogen gas and hydrogen gas as a carrier gas at predetermined compositional ratio by volume after raising a temperature of the substrate at a range of higher than 800° C. to lower than 1200° C. in feeding ammonia and nitrogen gas at a given molar ratio; cooling the substrate to room temperature after stopping the feeds of the Group III material of the organometallic compound and the p-type impurity material.

Accordingly, in the method for manufacturing a semiconductor light-emitting device, there can be manufactured a semiconductor optical device of good working efficiency, by a simple process, including the p-type nitride semiconductor formed by feeding the group III material of the organometallic compound, and the Group V materials including ammonia and the hydrazine derivative at given feed flow rates along with the p-type impurity material while preventing carbon (C) ascribed to the hydrazine derivative from being taken in the p-type nitride semiconductor layer and also preventing C formed from the Group III material of the organometallic compound from being taken in the p-type nitride semiconductor layer, thereby ensuring a low resistance of the layer.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

In the following embodiments, the p-type layer of a semiconductor optical device is illustrated. The invention is not always limited to application to semiconductor optical devices, but is applicable to a p-type layer of ordinary semiconductor devices including, for example, transistors. In addition, an instance of a blue-violet LD of a ridge waveguide type is illustrated, for example, as a semiconductor optical device, similar results are obtained by application to all types of blue-violet LD's, not limited to the ridge waveguide type of blue-violet LD.

First Embodiment

Figure 1:
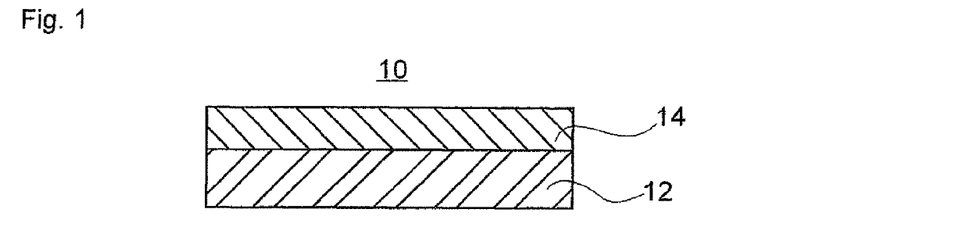
FIG. 1 is a schematic view showing a section of a GaN stacked structure according to one embodiment of the present invention.

FIG. 1 is a schematic view showing a section of a GaN stacked structure according to one embodiment of the present invention. It will be noted that like reference numerals indicate corresponding or like members throughout the drawings.

In FIG. 1, a GaN stacked structure 10 constitutes, for example, part of a stacked structure of blue-violet LD.

A GaN substrate 12 serving as a substrate makes use of a (0001) face as a main surface and a p-GaN layer 14 serving as a p-type nitride semiconductor layer is disposed on this main surface.

The manufacturing procedure of the GaN stacked structure 10 is illustrated.

In general, the crystal growth for forming a nitride semiconductor stacked structure is carried out by a metal organic chemical vapor deposition (MOCVD) method, molecular beam epitaxy (MBE), hydride vapor phase epitaxy (HVPE) or the like. The MOCVD method is, for example, used herein.

Trimethylgallium (TMGa), which is an organometallic compound, is used as a Group III material.

For a Group V material, ammonia gas and a hydrazine derivative such as, for example, 1,2-dimethylhydrazine are used. For a p-type impurity material, cyclopentadienylmagnesium ($CP_2Mg$) is used, for example.

The carrier gas used for these starting gases is a nitrogen ($N_2$) gas.

GaN is used, for example, as a substrate and the main surface for crystal growth is a (0001) face.

It will be noted that in this embodiment, trimethylgallium (TMGa) has been stated as used as an organometallic compound, and triethylgallium (TEGa) may be used instead.

Although 1,2-dimethylhydrazine is used as the hydrazine derivative, 1,1-dimethylhydrazine may be used instead.

Moreover, the GaN substrate has been stated as being used but not limited thereto, and sapphire, SiC and Si wafers may also be used.

The GaN substrate 12 is mounted in a reaction furnace of a MOCVD apparatus, after which while feeding ammonia gas at a rate of $1.3 \times 10^{-1}$ mols/minute and nitrogen gas at a rate of 20 liters/minute, the temperature of the GaN substrate 12 is raised, for example, to 1000° C.

After having raised the temperature of the GaN substrate 12 to 1000° C., the feeds of TMG at a rate of $1.2 \times 10^{-4}$ mols/minute, $CP_2Mg$ at a rate of $9.0 \times 10^{-7}$ mols/minutes and 1,2-dimethylhydrazine at a rate of $1.1\times10^{-3}$ mols/minute in addition to the ammonia gas fed as the Group V material are started along with the nitrogen gas serving as a carrier gas to form a 1 μm thick p-type GaN layer 14 ("n-type" is hereinafter referred to as "n-", "p-type" referred to as "p-" and an undoped case wherein no impurity is doped is hereinafter indicated as "i-") on the main surface of the GaN substrate 12.

In this case, the feed molar ratio of 1,2-dimethylhydrazine to the Group III material is at 9.4 and the fed molar ratio of ammonia to the 1,2-dimethylhydrazine is at 120.

Thereafter, the feeds of TMG used as the Group III material and CP$_2$Mg used as the p-type impurity material are stopped, followed by cooling down to about 300° C. under the feed of the Group V materials, and then stopping the feed of the Group V materials and further cooling down to room temperature.

It will be noted that when the feeds of TMGa of the Group III material and CP$_2$Mg of the p-type impurity material are stopped, ammonia gas is also stopped and the reaction system may be cooled down to about 300° C. while leaving 1,2-dimethylhydrazine as the Group V material. Since 1,2-dimethylhydrazine is decomposed at a temperature lower than ammonia, re-desorption of N from a crystal face becomes smaller in amount, thereby ensuring better surface morphology.

The p-GaN layer 14 grown in this way is subjected to hole measurement according to the Van der Pauw method to obtain a carrier (hole) concentration in the p-GaN layer 14. As a result, it has been found that the p-GaN layer 14 has a hole concentration of $7\times10^{17}$ cm$^{-3}$ and a resistivity of 0.7Ω cm at room temperature.

The p-GaN layer 14 based on this embodiment is compared with a p-GaN layer formed according to a conventional method.

The p-GaN layer formed by the conventional manufacturing method is grown in the same manner as the p-GaN layer 14 except that the Group V material used is ammonia gas alone. The layer in the as-grown condition is high in resistance, for which it is further thermally treated.

More particularly, after mounting a GaN substrate in a reaction furnace of an MOCVD apparatus, while feeding ammonia at $4.0\times10^{-1}$ mols/minute and nitrogen gas at 20 liters/minute, the temperature of the GaN substrate is raised, for example, to 1000° C.

After raising the temperature of the GaN substrate to 1000° C. the feeds of TMGa at $1.2\times10^{-4}$ mols/minute and CP$_2$Mg at $9.0\times10^{-7}$ mols/minute are started using, as a carrier gas, a mixed gas of nitrogen gas at a flow rate of 10 liters/minute and hydrogen (H$_2$) gas at a flow rate of 10 liters/minute, thereby growing a 1 μm thick p-GaN layer on the main surface of the GaN substrate.

Subsequently, TMGa of the Group III material and CP$_2$Mg of the p-type impurity material are stopped, followed by cooling down to about 300° C. under the feed of the Group V material, then stopping the feed of Group V material and cooling down to room temperature.

The p-GaN layer grown in this way is very high in resistance in an as-grown condition and cannot obtain electric conduction, for which the layer is thermally treated in an atmosphere of nitrogen (N$_2$) gas at 900° C. for conversion to p-type conductivity.

The thus thermally treated p-GaN layer is subjected to hole measurement by the Van der Pauw method, revealing that the p-GaN layer after the thermal treatment has a hole concentration of $7\times10^{17}$ cm$^{-3}$ at room temperature and a resistivity of 1.0 Ωcm.

After the p-GaN layer 14 according to this embodiment is grown, no thermal treatment is necessary in order to activate p-type impurities, resulting in a simpler procedure. Moreover, it will be seen that when compared with the p-GaN layer formed by the conventional manufacturing method and subjected to thermal treatment, the resistivity is reduced by about 30%.

Next, the reason why ammonia is added for the formation of the p-GaN 14 according to this embodiment along with a Group III material of an organometallic compound without use of only a hydrazine derivative, e.g. 1,2-dimethylhydrazine, as a Group V material is now illustrated.

When ammonia (NH$_3$) gas alone is used as a Group V material for the formation of a p-GaN layer, the H radical generated from NH$_3$ is taken in the crystal of p-GaN and reacts with a p-type impurity, thereby causing H passivation (a lowering of activity rate of the p-type impurity).

To avoid this, when ammonia gas used as a Group V material is replaced by dimethylhydrazine (UDMHy), the CH$_3$ radical generated from UDMHy reacts with the H radical formed simultaneously, so that the H radical generated from UDMHy is not taken in the crystal of p-GaN.

However, since trimethylgallium (TMGa) of an organometallic compound is used as a group III material, CH$_3$ radical is released from the TMGa. If this CH$_3$ radical is not discharged as CH$_4$, the CH$_3$ radical is taken in the crystal, thereby increasing a carbon concentration in the crystal and resulting in an increased resistivity of the p-GaN.

Accordingly, where ammonia gas is completely substituted with dimethylhydrazine (UDMHy) for use as a Group V material, H radical necessary for forming CH$_4$ from the CH$_3$ radical becomes insufficient in amount. In this embodiment, a given amount of NH$_3$, which is sufficient to supply H radical in amounts necessary for forming CH$_4$, is added.

More particularly, in order to reduce a concentration of carbon taken in the crystal upon the formation of the p-GaN layer from dimethylhydrazine (UDMHy), or to suppress carbon, with which an acceptor is compensated, from being taken in, the H radical necessary for discharging the CH$_3$ radical released from dimethylhydrazine (UDMHy) in the form of CH$_4$ is supplied from NH$_3$.

Simultaneously, if the H radical produced from NH$_3$ is too large in amount, H passivation takes place, for which a feed of NH$_3$ serving as a supply source of the H radical should be in an amount as close as a required minimum.

In this way, when using trimethylgallium as a Group III material, ammonia and dimethylhydrazine as Group V materials, and cyclopentadienylmagnesium (CP$_2$Mg) as a p-type impurity material, a nitride semiconductor stacked structure can be obtained which is provided with a p-type nitride semiconductor layer having a carbon concentration of not higher than $1 \times 10^{18}$ cm$^{-1}$.

When trimethylgallium, ammonia and dimethylhydrazine are fed at given ratios and cyclpentadienylmagnesium (CP$_2$Mg) is used as a p-type impurity, a nitride semiconductor stacked structure can be formed having a low carbon concentration and a low electric resistivity by a simple process.

Modification 1

In the manufacturing steps set out hereinabove, the case where nitrogen (N$_2$) gas alone is used as a carrier gas for starting gases has been illustrated, there may be used, as a carrier gas, a mixed gas of nitrogen (N$_2$) gas and hydrogen (H$_2$) gas, or hydrogen (H$_2$) gas alone.

More particularly, when a compositional ratio by volume of hydrogen gas is taken as x and a compositional ratio by volume of nitrogen gas is taken as 1−x, the manufacture is feasible using a mixed gas of hydrogen gas and nitrogen gas within a range of 1=x=0.

For instance, where hydrogen gas and nitrogen gas are mixed at 1:1 to provide a mixed gas, the nitrogen gas is fed at a feed flow rate of 10 liters/minute and the hydrogen gas is fed at a feed flow rate of 10 liters/minute to provide a mixed gas.

Other manufacturing conditions are the same as those manufacturing conditions using nitrogen gas alone as a carrier gas.

It has been found that when the p-GaN layer of Modification 1 made by use of a carrier gas that is made of a mixed gas of nitrogen (N$_2$) gas and hydrogen (Hz) gas as stated above is compared with the p-GaN layer 14 made under the former manufacturing conditions using nitrogen (N$_2$) gas alone as a carrier gas, surface morphology is better.

The p-GaN layer 14 of Modification 1 grown in this way is subjected to hole measurement by the Van der Pauw method to obtain a carrier (hole) concentration of the p-GaN layer 14. As a result, it has been found that the p-GaN layer 14 of Modification 1 has a hole concentration of $5 \times 10^{17}$ cm$^{-3}$ at room temperature and a resistivity of 0.9Ω·cm.

Since the p-GaN layer 14 of Modification 1 exhibits p-type conduction, no thermal treatment is needed. By way of experiment, it has been found that when thermal treatment is carried out in an atmosphere of nitrogen (N$_2$) gas at 700° C., there can be obtained a p-GaN layer whose hole concentration increases to $7 \times 10^{17}$ cm$^{-3}$ and which has such a very good electric characteristic that the resistivity is at 0.6Ω·cm.

The p-GaN layer 14 of Modification 1 having been subjected to the additional thermal treatment exhibits a resistivity after the thermal treatment, which is lower than the p-GaN layer 14 formed by use of a carrier gas made up of nitrogen (N$_2$) gas alone. This is considered for the reason that the use, as a carrier gas, of a mixed gas of nitrogen (N$_2$) gas and hydrogen (H$_2$) gas enables surface flatness to be improved, thereby improving crystallinity.

Figure 2:
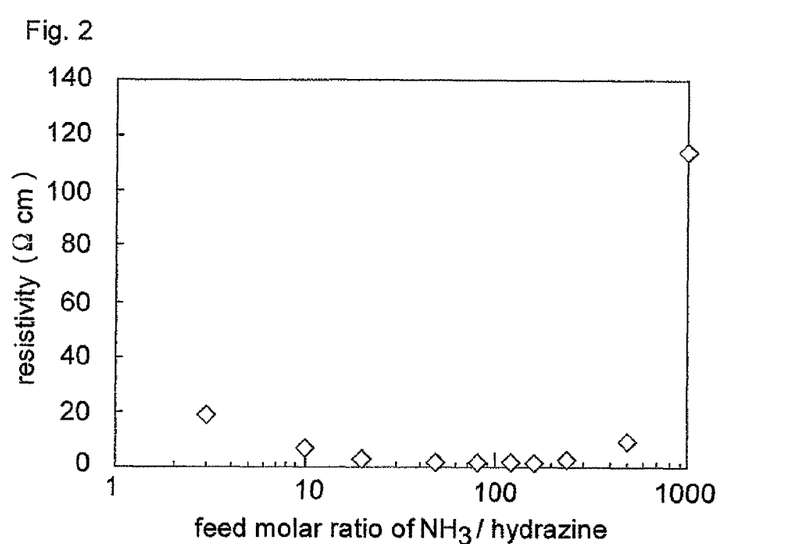
FIG. 2 is a graph showing a dependence of the resistivity of a p-GaN layer on the feed molar ratio of $NH_3$/hydrazine according to the one embodiment of the present invention.

FIG. 2 is a graph showing a dependence of the resistivity of a p-GaN layer on the feed molar ratio of NH$_3$/hydrazine according to the one embodiment of the present invention.

The abscissa of FIG. 2 indicates a feed molar ratio of NH$_3$/hydrazine, or a feed molar flow rate of NH$_3$ relative to a feed molar flow rate of hydrazine, and the ordinate indicates a resistivity (Ωcm) of a p-GaN layer.

The graph of FIG. 2 is for the case where a growth temperature is at 1000° C., a hydrazine feed molar flow rate relative to a Group III feed molar flow rate is at 9.4 and a carrier gas used is a mixed gas of nitrogen (N$_2$) gas and hydrogen (H$_2$) gas with the ratio being at 1:1.

In FIG. 2, when the feed molar ratio of NH$_3$/hydrazine is at 10 or below, H radical supply becomes insufficient, thereby increasing a carbon concentration in crystal and thus being high in resistance. On the other hand, the feed molar ratio of NH$_3$/hydrazine abruptly increases within a range between 500 and 1000. This is for the reason that H is taken in the crystal owing to excess feed of NH$_3$ and H passivation takes place. In view of this, the NH$_3$/hydrazine feed molar ratio is within a range of 10 to less than 1000, preferably from 20 to 500.

Figure 3:
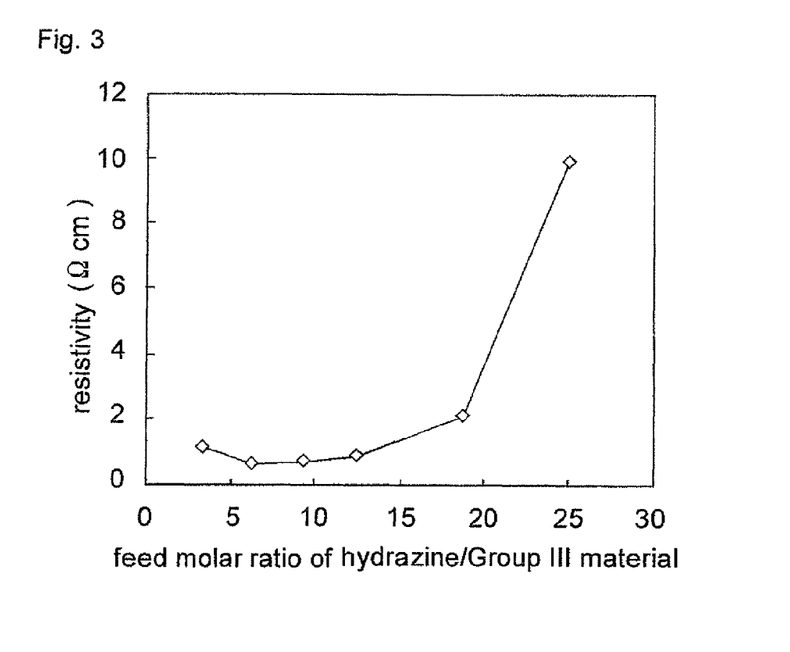
FIG. 3 is a graph showing a dependence of the resistivity of a p-GaN layer on the feed molar ratio of hydrazine/Group III material according to the one embodiment of the present invention.

FIG. 3 is a graph showing a dependence of the resistivity of a p-GaN layer on the feed molar ratio of hydrazine/Group III material according to the one embodiment of the present invention.

The abscissa of FIG. 3 indicates a feed molar ratio of hydrazine/Group III material, or a feed molar flow rate of hydrazine relative to a feed molar flow rate of Group III material, and the ordinate indicates a resistivity (Ωcm) of a p-GaN layer. The graph of FIG. 3 is for the case where a growth temperature is at 1000° C., an NH$_3$/hydrazine feed molar ratio is at 120 and a carrier gas used is a mixed gas of nitrogen (N$_2$) gas and hydrogen (H$_2$) gas with the ratio being at 1:1.

In FIG. 3, the resistivity abruptly increases between hydrazine/Group III material feed molar ratios of 20 and 25, which is ascribed to an increased concentration of carbon in the crystal, for which the hydrazine/Group III feed molar ratio should be smaller than 25. If the hydrazine/group III material feed molar ratio is smaller than 1, Group V vacancies occur in the crystal, thereby causing crystal degradation. Accordingly, the hydrazine/Group III material feed molar ratio preferably ranges from 1 to smaller than 20, more preferably from 3 to 15.

Figure 4:
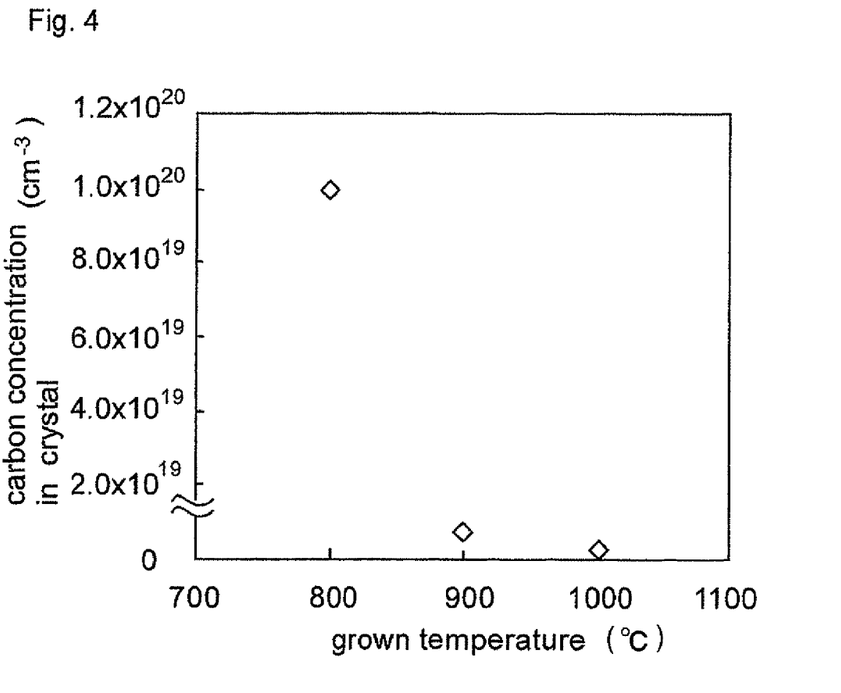
FIG. 4 is a graph showing a dependence of the carbon concentration of a p-GaN layer on the growth temperature according to the one embodiment of the present invention.

FIG. 4 is a graph showing a dependence of the carbon concentration of a p-GaN layer on the growth temperature according to the one embodiment of the present invention.

The abscissa of FIG. 4 indicates a growth temperature that corresponds to a substrate temperature. The ordinate indicates a carbon concentration in the crystal. The graph of FIG. 4 is for the case where a hydrazine/Group III material feed molar ratio is at 9.4, an NH$_3$/hydrazine feed molar ratio is at 120 and a carrier gas used is a mixed gas of nitrogen (N$_2$) gas and hydrogen (H$_2$) gas with a ratio being at 1:1.

In FIG. 4, because the carbon concentration in the crystal abruptly decreases at a temperature ranging from 800° C. to 900° C., the growth temperature should exceed 800° C. It is considered that if the growth temperature is lower, decomposition of ammonia reduces in amount, with the result that CH$_3$ radical is not discharged in the form of CH$_4$ and is taken in the crystal. The upper limit of temperature at which crystal growth of p-GaN is possible is at 1200° C. Accordingly, the growth temperature in a manufacturing procedure is within a range of higher than 800° C. to lower than 1200° C., preferably from 900° C. to lower than 1200° C.

Figure 5:
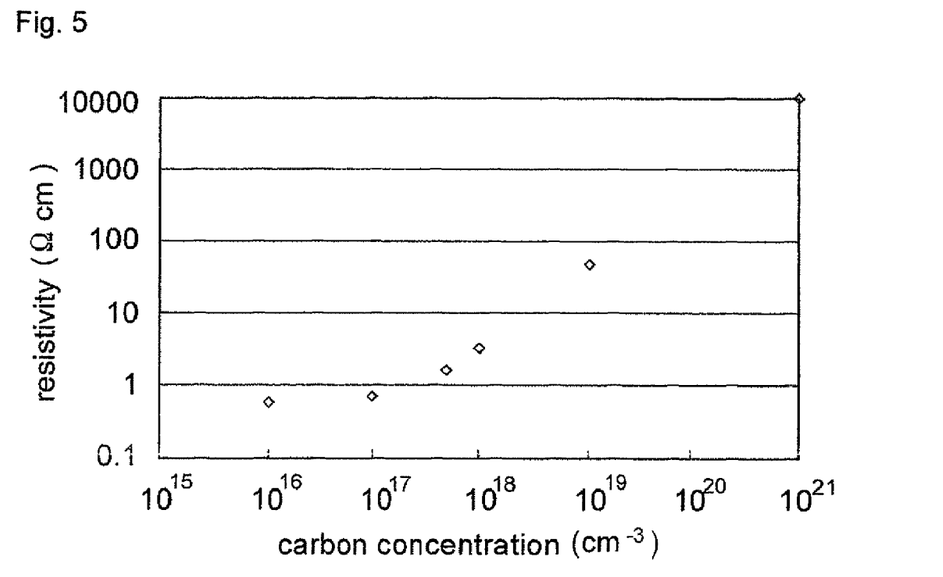
FIG. 5 is a graph showing a dependence of the resistivity of a p-GaN on the carbon concentration according to the one embodiment of the present invention.

FIG. 5 is a graph showing a dependence of the resistivity of a p-GaN on the carbon concentration according to the one embodiment of the present invention.

The abscissa of FIG. 5 indicates a carbon concentration in a p-GaN layer and the ordinate indicates a resistivity.

In FIG. 5, $1\times10^{16}$ cm$^{-3}$ is a value of a detection limit of carbon and it is considered that when taking a maximum resistance value employed as a device into account, the carbon concentration in the p-GaN layer is at $1\times10^{18}$ cm$^{-3}$ below.

Although it is preferable that no carbon is present in the crystal of P-GaN, but carbon is, more or less, taken in the crystal of p-GaN when using a hydrazine. Proper selection of manufacturing conditions according to this embodiment enables the carbon concentration in the p-GaN layer to be at a level of not higher than $1\times10^{18}$ cm$^{-3}$.

It will be noted that if hydrogen gas alone is used as a carrier gas, a p-GaN layer of low resistance is formed. Hydrogen gas does not dissociate at a growth temperature of about 1000° C. and thus exists in the form of hydrogen molecules, which are not taken in the crystal. It is considered that the hydrogen radical taken in the crystal is made up mainly of H radicals decomposed from ammonia, so that if hydrogen gas alone is used as a carrier gas, a p-GaN layer of low resistance is formed.

Accordingly, the compositional ratio by volume of hydrogen gas is taken as x and the compositional ratio by volume of nitrogen gas taken as 1−x, the use of a mixed gas of hydrogen gas and nitrogen gas within a range of 1=x=0 ensures the formation of p-GaN layer of low resistance.

As stated hereinabove, the nitride semiconductor stacked structure according to the one embodiment of the present invention comprises: a substrate; and a p-type nitride semiconductor layer formed, on the substrate, by materials including a Group III material of an organometallic compound, Group V materials including ammonia and a hydrazine derivative, and a p-type impurity material, the p-type nitride semiconductor layer having a carbon concentration of not higher than $1\times10^{18}$ cm$^{-3}$. In this arrangement, there can be constituted a nitride semiconductor stacked structure comprising a p-type nitride semiconductor layer of low resistance, which is formed by the Group III material of an organometallic compound and the Group V materials including ammonia and a hydrazine derivative, has a carbon concentration of not higher than $1\times10^{18}$ cm$^{-3}$ and has a good working efficiency.

A method for manufacturing a nitride semiconductor stacked structure according to one embodiment of the present invention comprises: mounting a substrate in a reaction furnace, feeding a given type of Group V material and raising a temperature of the substrate to a range of higher than 800° C. to lower than 1200° C.; forming a p-type nitride semiconductor layer on the substrate at the raised substrate temperature by feeding a Group III material of an organometallic compound, Group V materials including ammonia and a hydrazine derivative, and a p-type impurity material at predetermined molar flow rates, respectively, at a feed molar ratio of the hydrazine derivative to the Group III material being smaller than 25 and a feed molar ratio of the ammonia to the hydrazine derivative being within a range of not smaller than 10 to smaller than 1000 along with nitrogen gas and hydrogen gas as a carrier gas at predetermined compositional ratio by volume; and cooling the substrate to room temperature after stopping the feeds of the Group III material of the organometallic compound and the p-type impurity material. Accordingly, in this manufacturing method, there can be formed a p-type nitride semiconductor layer, which is formed by feeding the Group III material of an organometallic compound and the Group V materials including ammonia and a hydrazine derivative at given feed flow rates along with a p-type impurity material, is prevented from carbon, ascribed to the hydrazine derivative, being taken therein. In addition, C formed from the Group III material of an organometallic compound is also prevented from being taken in the p-type nitride semiconductor layer. Thus, there can be manufactured, by a simple process, a nitride semiconductor stacked structure of a good working efficiency which includes the p-type nitride semiconductor layer of low resistance.

Second Embodiment

Figure 6:
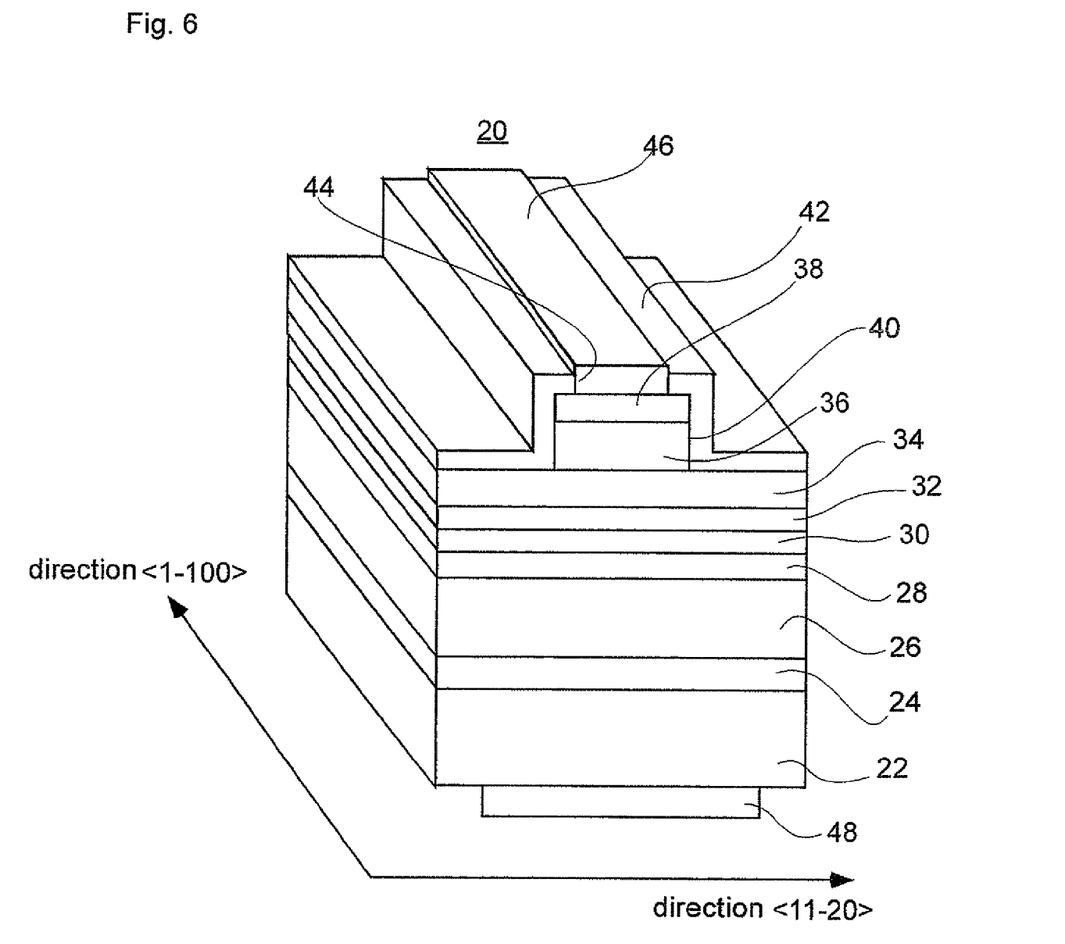
FIG. 6 is a perspective view of LD according to one embodiment of the present invention.

FIG. 6 is a perspective view of LD according to one embodiment of the present invention.

In FIG. 6, LD 20 is a blue-violet LD having a ridge-type waveguide and includes a n-GaN substrate 22 used as a substrate. There are successively stacked, on a (0001) face serving as a main surface of the n-GaN substrate 22, a 1 µm thick buffer layer 24 made of n-GaN, a 1.0 µm thick cladding layer 26 formed of n—Al$_{0.07}$Ga$_{0.93}$N on the buffer layer a 0.1 µm thick n-side optical guide layer 28 made of n-GaN on the n-cladding layer and an active layer 30.

The active layer 30 has a multiple quantum well structure provided with three pairs of 3.5 µm thick well layers made of In$_{0.12}$Ga$_{0.88}$N and 7.0 nm thick barrier layers made of GaN, which are alternately stacked.

There are successively formed, over the active layer 30, a 0.2 µm thick p-type electron barrier layer 32 formed of p—Al$_{0.07}$Ga$_{0.93}$N and a 0.1 µm thick p-side optical guide layer 34 formed of p-GaN. Next, a 0.4 µm thick p-cladding layer 36, which constitutes part of a mesa-shaped portion and is formed of p—Al$_{0.07}$Ga$_{0.93}$N, is formed on the p-side optical guide layer 34, and a 0.1 µm thick p-type contact layer 38, which is formed on this p-cladding layer 36 and also constitutes part of the mesa-shaped portion, is formed on the p-cladding layer 36.

The p-cladding layer 36 and the p-contact layer 38 result in the formation of a waveguide ridge 40. The waveguide ridge 40 is disposed at a central portion along a width of a cleavage surface serving as a resonator end face of LD20 and extends between the opposite cleavage surfaces serving as resonator end faces.

A silicon oxide film 42 made, for example, of SiO$_2$ is provided on the side walls of the waveguide ridge 40 and the exposed surface of the p-side optical guide layer 34. An opening 44 of the silicon oxide film 42 is provided in the upper surface of the waveguide ridge 40 to expose the surface of the p-contact layer 38. A p-side electrode 46 made of Pt and Au films is provided in contact and electric connection with the exposed p-contact layer. Moreover, an n-side electrode 48, which is formed by successive stacking of Ti and Al films by a vacuum deposition method, is disposed at the back side of the n-GaN substrate 22.

Next, a method for manufacturing the LD 20 is now described.

For a crystal growth method of a semiconductor stacked structure, an MOCVD method is used, for example.

The Group III material used includes trimethylgallium (TMGa), trimethylaluminium (TMA) or trimethylindium (TMI).

For the Group V material, ammonia (NH$_3$) gas and a hydrazine derivative such as, for example, 1,2-dimethylhydrazine, are used. An n-type impurity material used includes, for example, monosilane (SiH$_4$) and a p-type impurity material used includes, for example, cyclopentadienylmagnesium (CP$_2$Mg).

A mixed gas of nitrogen gas and hydrogen gas is provided as a carrier gas and while feeding ammonia (NH$_3$) gas, an n-GaN substrate 22 is raised, for example, to a temperature of 1000° C. Thereafter, the feeds of trimethylgallium (TMGa)

gas and monosilane ($SiH_4$) gas are started to grow a 1 μm thick buffer layer 24, formed of n-GaN, on the main surface of the n-GaN substrate 22.

Next, the feed of the trimethylalminum (TMA) is started to grow a 1.0 μm thick n-cladding layer 26 formed of n—$Al_{0.07}Ga_{0.93}N$.

After that, the feed of the trimethylalminum (TMA) is stopped to grow a 0.1 μm n-GaN optical guide layer.

Next, the feeds of the trimethylgallium (TMGa) gas and monosilane ($SiH_4$) gas are stopped and the substrate temperature is dropped to 700° C.

Thereafter, nitrogen gas alone is used as a carrier gas, followed by feeding trimethylgallium (TMGa) gas, trimethylindium (TMI) gas and ammonia ($NH_3$) gas to grow a 3.5 nm thick well layer made of $In_{0.12}Ga_{0.88}N$. Feed of trimethylindium (TMI) is stopped and trimethylgallium (TMGa) gas and ammonia ($NH_3$) gas are fed to form a 7.0 nm thick barrier layer made of GaN, followed by alternate stacking to form three-paired layers to grow an active layer 30 having an MQW structure.

Subsequently, a p-type layer is formed. For the formation of the p-type layer, such a procedure as described in the first embodiment is performed.

The carrier gas used for the formation of the p-type layer may be any of nitrogen gas alone, a mixed gas of nitrogen gas and hydrogen gas, or hydrogen gas alone. As illustrated in the first embodiment, the compositional ratio by volume of hydrogen gas is taken as x and the compositional ratio by volume of nitrogen gas is taken as 1−x, a mixed gas of hydrogen gas and nitrogen gas within a range of 0=x=1 may be used for the manufacture. For an instance, a mixed gas of hydrogen gas and nitrogen gas used herein is mixed at 1:1, and is provided such that the feed flow rate of hydrogen gas is at 10 liters/minute and the feed flow rate of nitrogen gas is at 10 liters/minute.

Initially, while feeding ammonia gas at $1.3 \times 10^{-1}$ mols/minute and nitrogen gas at 20 liters/minute, the substrate temperature is again raised from 700° C. to 1000° C., after which a mixed gas of hydrogen gas and nitrogen gas at 1:1 is provided as a carrier gas, followed by starting the feeds of trimethylgallium (TMGa) gas as a Group III material at $2.4 \times 10^{-4}$ mols/minute, trimethylaluminium (TMA) gas at $4.4 \times 10^{-5}$ mols/minute, cyclopentadienylmagnesium ($CP_2Mg$) at $3.0 \times 10^{-7}$ mols/minute, and 1,2-dimethylhydrazine as a Group V material at $1.1 \times 10^{-3}$ mols/minute in addition to the ammonia gas, thereby growing a 0.02 μm thick p-type electron barrier layer 32 made of p—$Al_{0.2}Ga_{0.8}N$. In this case, the feed molar ratio of 1,2-dimethylhydrazine to the Group III material is at 3.9 and the feed ratio of ammonia to 1,2-dimethylhydrazine is at 120.

Next, the feed of trimethylaluminium (TMA) is stopped, and TMG, $CP_2Mg$ and 1,2-dimethylhydrazine provided as a Group V material in addition to ammonia gas fed as a Group V material are, respectively, fed along with the carrier gas at flow rates of $1.2 \times 10^{-4}$ mols/minute, $1.0 \times 10^{-7}$ mols/minute and $1.1 \times 10^{-3}$ mols/minute, thereby growing a 0.1 μm thick p-side optical guide layer 34 made of p-GaN.

Next, the feed of trimethylaluminium (TMA) is again started, so that trimethylgallium (TMGa) gas is fed at $2.4 \times 10^{-4}$ mols/minute, trimethylaluminium (TMA) gas fed at $1.4 \times 10^{-5}$ mols/minute and cyclopentadienylmagnesium ($CP_2Mg$) fed at $3.0 \times 10^{-7}$ mols/minute, to form a 0.4 μm thick p-cladding layer 36 formed of p—$Al_{0.07}Ga_{0.93}N$. In this case, the feed molar ratio of 1,2-diemthylhydrazine to the Group III material is at 4.3 and the feed ratio of ammonia to 1,2-dimethylhydrazine is at 120. This p-cladding layer 36 had a carbon concentration of not higher than $1 \times 10^{18}$ cm$^{-3}$.

Next, the feed of trimethylaluminium (TMA) is stopped, followed by feeding, along with the carrier gas, TMG at a flow rate of $1.2 \times 10^{-4}$ mols/minute, $CP_2Mg$ at a flow rate of $9.0 \times 10^{-7}$ mols/minute and 1.2-dimethylhydrazine provided as a Group V material at a flow rate of $1.1 \times 10^{-3}$ mols/minute in addition to ammonia gas fed as a Group V material, respectively, thereby growing a 0.1 μm thick p-type contact layer 38 formed of p-GaN.

It will be noted that for the formation of the p-type layer, the feed molar ratio of 1,2-dimethylhydrazine to the Group III material is at 9.4 and the feed molar ratio of ammonia to 1,2-dimethylhydrazine is at 120 as in the first embodiment.

The p-type layer of the second embodiment is formed under the following manufacturing conditions as used in the first embodiment.

More particularly, it is necessary that the feed molar ratio of hydrazine/Group III material be at smaller than 25, preferably from 1 to smaller than 20, more preferably from 3 to 15.

The feed molar ratio of $NH_3$/hydrazine is within a range of from 10 to smaller than 1000, preferably from 20 to 500.

The growth temperature in the manufacturing procedure is within a range exceeding 800° C., but lower than 1200° C., preferably from 900° C. to lower than 1200° C.

Like the first embodiment, in the second embodiment where a hydrazine is used to form, for example, p-GaN, carbon is inevitably taken in the crystal of p-GaN in some degree. The use of the manufacturing method according to this embodiment enables one to make a carbon concentration in the p-GaN layer of not larger than $1 \times 10^{18}$ cm$^{-3}$.

Thereafter, the feeds of TMG used as a Group III material and $CP_2Mg$ serving as an n-type impurity material are stopped, followed by cooling down to about 300° C. under the feed of the Group V materials, then stopping the feed of the Group V materials and cooling down to room temperature.

It will be noted that when the feeds of TMG used as a Group III material and $CP_2Mg$ used as a p-type impurity material are stopped, it may be possible to stop ammonia gas and cool down to about 300° C. while leaving 1,2-dimethylhydrazine as a Group V material.

Next, a waveguide ridge 40 is formed.

A resist is coated onto the entire surface of the wafer after completion of the crystal growth and subjected to lithography to form a resist pattern corresponding to a shape of a mesa-shaped portion. Using this resist pattern as a mask, the p-cladding layer 36 may be removed, for example, by a reactive ion etching (RIE) method or may be etched to such an extent that the p-cladding layer 36 is slightly left. According to this etching, a waveguide ridge 40 serving as an optical waveguide structure is formed. The etching gas for the RIE includes, for example a chlorine gas.

Next, while leaving the resist pattern used as a mask as it is, a silicon oxide film 42 made, for example, of a 0.2 μm thick $SiO_2$ film is again formed over the entire surface of the n-GaN substrate 22, for example, by a CVD method, a vacuum deposition method, a sputtering method or the like. Simultaneously with the removal of the resist, the silicon oxide film 42 on the waveguide ridge 40 is removed according to a so-called liftoff method. As a result, an opening 44 is formed in the silicon oxide film 42 on the waveguide ridge 40.

Next, Pt and Au films are successively formed over the entire surface of the n-GaN substrate 22 by a vacuum deposition method, for example. Then, a resist is applied to it and a p-side electrode 46 is formed. The p-side electrode 46 is electrically connected to the surface of the p-contact layer 38 exposed by the opening 44.

Next, Ti and Al films are successively formed over the back surface of the n-GaN substrate 22 by a vacuum deposition method, followed by alloying for permitting ohmic contact of an n-side electrode 48.

Thereafter, the n-GaN substrate 22 is processed in the form of a bar such as by cleavage to form opposite end faces of a resonator and coating the end faces of the resonator. The bar is subjected to cleavage into a chip to complete LD 20.

In the LD 20 of the second embodiment, where the p-type layer is formed, the feed molar ratio of hydrazine/Group III material is at smaller than 25, preferably from 1 to smaller than 20, and more preferably from 3 to 15, and the feed molar ratio of $NH_3$/hydrazine is within a range of from 10 to smaller than 1000, preferably from 20 to 500. Moreover, the growth temperature in the manufacturing procedure is within a range exceeding 800° C., but lower than 1200° C., preferably from 900° C. to lower than 1200° C.

Accordingly, where the Group V material is completely changed from ammonia gas to dimethylhydrazine (UDMHy), H radical necessary for producing $CH_4$ from $CH_3$ radical becomes deficient. In this embodiment, a given amount of $NH_3$ is added so as to supply H radical in amounts necessary for the formation of $CH_4$.

More particularly, in order to reduce a concentration of carbon taken in the crystal for the formation of the p-GaN layer by use of dimethylhydrazine (UDMHy), or to suppress carbon from being taken in, with which the acceptor is compensated, H radical that is necessary for discharging, as $CH_4$, $CH_3$ radical released from dimethylhydrazine (UDMHy) is supplied from $NH_3$.

Simultaneously, if H radical formed from $NH_3$ is in excess, H passivation takes place, for which a feed of $NH_3$ serving as a supply source of H radical should be in an amount as close as a required minimum.

When using trimethylgallium as a Group III material, ammonia and dimethylhydrazine as a Group V material and cyclopentadienylmagnesium ($CP_2Mg$) as a p-type impurity material, there can be obtained a semiconductor light-emitting device provided with a p-type nitride semiconductor layer having a carbon concentration of not higher than $1 \times 10^{18}$ $cm^{-3}$.

When feeding trimethylgallium, ammonia and dimethylhydrazine at given ratios and using cyclopentadienylmagnesium ($CP_2Mg$) as a p-type impurity, there can be manufactured, by a simple process, a semiconductor light-emitting device having a p-type nitride semiconductor layer that is low in carbon concentration and electric resistance.

As stated hereinabove, the semiconductor light-emitting device according to one embodiment of the present invention comprises: a substrate; an n-type cladding layer of a nitride semiconductor on the substrate; an active layer on the n-type cladding layer; and a p-type cladding layer formed, on the active layer, by materials including a Group III material of an organometallic compound, Group V materials including ammonia and a hydrazine derivative, and a p-type impurity material, the p-type cladding layer having a carbon concentration of not higher than $1 \times 10^{18}$ $cm^{-3}$. Thus, In this arrangement, there can be constituted a semiconductor light-emitting device including a p-type cladding layer of a p-type nitride semiconductor, which is formed by use of a Group III material of an organometallic compound, Group V materials including ammonia and a hydrazine derivative in combination and has a carbon concentration of not higher than $1 \times 10^{18}$ $cm^{-3}$ and a low resistance, such a device having a good working efficiency.

A method for manufacturing a semiconductor light-emitting device according to one embodiment of the invention comprises: mounting a substrate in a reaction furnace, feeding a given type of Group V material and raising a temperature of the substrate to a range of higher than 800° C. to lower than 1200° C.; forming a n-type nitride semiconductor layer on the substrate at the raised substrate temperature by feeding a Group III material, Group V material, and a n-type impurity material at predetermined molar flow rates, respectively; forming an active layer of a nitride semiconductor having a quantum well structure at a given growth temperature by feeding a Group III material and Group V material at predetermined molar flow rates, respectively; forming a p-type nitride semiconductor layer by feeding a Group III material of an organometallic compound, Group V materials including ammonia and a hydrazine derivative, and a p-type impurity material at predetermined molar flow rates, respectively, at a feed molar ratio of the hydrazine derivative to the Group III material of an organometallic compound being smaller than 25 and a feed molar ratio of the ammonia to the hydrazine derivative being within a range of not smaller than 10 to smaller than 1000 along with nitrogen gas and hydrogen gas as a carrier gas at predetermined compositional ratio by volume after raising a temperature of the substrate at a range of higher than 800° C. to lower than 1200° C. in feeding ammonia and nitrogen gas at a given molar ratio; cooling the substrate to room temperature after stopping the feeds of the Group III material of the organometallic compound and the p-type impurity material. In this manufacturing method, a semiconductor optical device of good working efficiency can be manufactured, by a simple process, including the p-type nitride semiconductor formed by feeding the group III material of the organometallic compound, and the Group V materials including ammonia and the hydrazine derivative at given feed flow rates along with the p-type impurity material while preventing carbon (C) ascribed to the hydrazine derivative from being taken in the p-type nitride semiconductor layer and also preventing C formed from the Group III material of the organometallic compound from being taken in the p-type nitride semiconductor layer, thereby ensuring a low resistance of the layer.

As stated hereinabove, the nitride semiconductor stacked structure and the semiconductor optical device, and the methods for manufacturing such a structure and device according to the invention are adapted for improving the performance of the nitride semiconductor stacked structure and semiconductor optical device formed by using a Group III material and Group V materials including ammonia and a hydrazine derivative and are suited for simplifying manufacturing procedures.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a nitride semiconductor stacked structure, comprising:
    mounting a substrate in a reaction furnace, feeding into the reaction furnace a compound including a Group V element and raising temperature of the substrate to within a range from higher than 900° C. to lower than 1200° C.;
    forming a p-type nitride semiconductor layer on the substrate at the substrate temperature by feeding into the reaction furnace
        an organometallic compound including a Group III element, compounds including a Group V element and including ammonia and a hydrazine derivative, and a p-type impurity source material at respective molar flow rates, wherein molar flow ratio of the hydrazine derivative to the organometallic compound including a Group III element is within a range from 1 to smaller than 25, and molar flow ratio of the ammonia to the hydrazine derivative is within a range from 10 to smaller than 500, and nitrogen and hydrogen as carrier gases at a predetermined compositional ratio by volume, so that the p-type nitride semiconductor layer has a relatively low resistivity, as formed, and without being thermally treated; and cooling the substrate to room temperature after stopping the feeds of the organometallic compound including a Group III element and the p-type impurity material.

2. The method for manufacturing a nitride semiconductor stacked structure according to claim 1, including stopping the flow of the ammonia while cooling the substrate to room temperature.

3. The method for manufacturing a nitride semiconductor stacked structure according to claim 1, wherein, in forming the p-type nitride semiconductor layer, molar flow ratio of the hydrazine derivative to the organometallic compound including a Group III element does not exceed 15.

4. The method for manufacturing a nitride semiconductor stacked structure according to claim 1, wherein the hydrazine derivative is selected from the group consisting of 1,1-dimethylhydrazine and 1,2-dimethylhydrazine.

5. A method for manufacturing a semiconductor light-emitting device, comprising:

mounting a substrate in a reaction furnace, feeding into the reaction furnace a material including a Group V element and raising temperature of the substrate to within a range from higher than 900° C. to lower than 1200° C.;

forming an n-type nitride semiconductor layer on the substrate at the substrate temperature by feeding into the reaction furnace a material including a Group III element, a material including a Group V element, and a n-type impurity source material at respective molar flow rates;

forming an active layer of a nitride semiconductor having a quantum well structure at a growth temperature by feeding into the reaction furnace a material including a Group III element and a material including a Group V element at respective molar flow rates;

forming a p-type nitride semiconductor layer by feeding an organometallic compound including a Group III element, compounds including a Group V element, including ammonia and a hydrazine derivative, and a p-type impurity source material at respective molar flow rates, wherein molar flow ratio of the hydrazine derivative to the organometallic compound containing a Group III element is within a range from 1 to smaller than 25, and molar flow ratio of the ammonia to the hydrazine derivative is within a range from 10 to smaller than 500, and nitrogen and hydrogen as carrier gases at a predetermined compositional ratio by volume, after raising the temperature of the substrate to a temperature within a range from higher than 900° C. to lower than 1200° C., while feeding into the reaction furnace ammonia and nitrogen at a given molar flow ratio, so that the p-type nitride semiconductor layer has a relatively low resistivity, as formed, and without being thermally treated; and cooling the substrate to room temperature after stopping the feeds into the reaction furnace of the organometallic compound and the p-type impurity material.

6. The method for manufacturing a semiconductor light-emitting device according to claim 5, including stopping feeding into the reaction furnace of the ammonia while cooling the substrate to room temperature.

7. The method for manufacturing a semiconductor light-emitting device according to claim 5, wherein, in forming the p-type nitride semiconductor layer, molar flow ratio of the hydrazine derivative to the organometallic compound including a Group III element does not exceed 15.

8. The method for manufacturing a semiconductor light-emitting device according to claim 5, wherein the hydrazine derivative is selected from the group consisting of 1,1-dimethylhydrazine and 1,2-dimethylhydrazine.

9. The method for manufacturing a nitride semiconductor stacked structure according to claim 1, wherein, in forming the p-type nitride semiconductor layer, molar flow ratio of the hydrazine derivative to the organometallic compound including a Group III element is smaller than 20 and at least 5.

10. The method for manufacturing a semiconductor light-emitting device according to claim 5, wherein, in forming the p-type nitride semiconductor layer, molar flow ratio of the hydrazine derivative to the organometallic compound including a Group III element is smaller than 20 and at least 5.

* * * * *